(12) United States Patent
Surya et al.

(10) Patent No.: US 7,470,940 B2
(45) Date of Patent: Dec. 30, 2008

(54) ULTRAVIOLET DETECTOR

(75) Inventors: Charles Surya, Kowloon (HK); Patrick Wai-Keung Fong, Kowloon (HK)

(73) Assignee: The Hong Kong Polytechnic University, Kowloon (HK)

( * ) Notice: Subject to any disclaimer, the term of this patent is extended or adjusted under 35 U.S.C. 154(b) by 460 days.

(21) Appl. No.: 11/404,568

(22) Filed: Apr. 14, 2006

(65) Prior Publication Data

US 2006/0273325 A1  Dec. 7, 2006

(30) Foreign Application Priority Data

Apr. 15, 2005  (CN) .................. 2005 1 0065762

(51) Int. Cl.
*H01L 29/732* (2006.01)
*H01L 31/00* (2006.01)
*H01L 27/095* (2006.01)

(52) U.S. Cl. .................. 257/184; 257/472; 257/485; 257/E31.065

(58) Field of Classification Search .................. 257/184, 257/472, 485, E31.065
See application file for complete search history.

(56) References Cited

U.S. PATENT DOCUMENTS

| | | | |
|---|---|---|---|
| 5,677,538 A | 10/1997 | Moustakas et al. | |
| 6,137,123 A * | 10/2000 | Yang et al. | 257/184 |
| 6,345,063 B1 * | 2/2002 | Bour et al. | 372/45.01 |
| 6,690,042 B2 * | 2/2004 | Khan et al. | 257/192 |
| 7,170,111 B2 * | 1/2007 | Saxler | 257/194 |
| 2004/0036086 A1 * | 2/2004 | Khan et al. | 257/200 |
| 2007/0259510 A1 * | 11/2007 | Udagawa | 438/483 |
| 2008/0135852 A1 * | 6/2008 | Udagawa | 257/76 |

\* cited by examiner

*Primary Examiner*—Ngan Ngo
(74) *Attorney, Agent, or Firm*—Hamre, Schumann, Mueller & Larson, P.C.

(57) ABSTRACT

An UV detector, comprising: a sapphire substrate; a high temperature AlN buffer layer grown on the sapphire substrate; an intermediate temperature GaN buffer layer grown on the high temperature AlN buffer layer; a GaN epitaxial layer deposited on the intermediate temperature GaN buffer layer; a Schottky junction formed on top of the GaN epitaxial layer; and a plurality of ohmic contacts also formed on top of the GaN epitaxial layer, wherein, the high temperature AlN buffer layer and the intermediate temperature GaN buffer layer together form a double buffer layer structure so as to improve the reliability and radiation hardness of the UV detector; and wherein the high temperature AlN buffer layer and the intermediate temperature GaN buffer layer are formed by RF-plasma enhanced MBE growth technology.

6 Claims, 3 Drawing Sheets

ULTRAVIOLET DETECTOR

FIELD OF THE INVENTION

The present invention relates to an ultraviolet (hereinafter referred to as "UV") detector, and more particularly to an UV detector with significantly improved reliability and lifetime by adopting a double buffer layer structure.

BACKGROUND ART

UV radiation can be applied to many fields, such as UV sterilization, UV physiotherapy, UV fluorescent analysis and investigation, UV exposure of photolithography and so on. However, devastating effects of UV radiation may be very dangerous in some cases. For example, cultural relics, paintings and calligraphy works, rubber and plastics will undergo an accelerated aging process under a prolonged exposure to UV irradiation. Moreover, UV radiation may also have devastating effects on eyes, skins, plants and so on. It is very important therefore to be able to detect and determine the intensity and amount of UV radiation.

Gallium nitride (hereinafter referred to as "GaN") material possesses characteristics of having wide energy gap, high voltage resistance and high temperature resistance and so on, and can be used in the development of UV detecting devices. The UV detecting devices made of GaN can be used in different kinds of environment and for different industrial applications, such as measuring the amount of UV radiation for fire detection, biological examination, air pollution detection and so on.

In general, the UV detector is fabricated by forming GaN Schottky junctions on a GaN thin film grown by Molecular Beam Epitaxy (hereinafter referred to as "MBE") or metalorganic chemical vapor deposition (MOCVD). The conventional UV detector only comprises a high temperature Aluminum Nitride (hereinafter referred to as "AlN") buffer layer interposed between a sapphire substrate and a GaN epitaxial layer. The reliability and lifetime of such configured UV detector is usually unsatisfactory and the accuracy thereof decreases significantly after a prolonged exposure to high intensity UV irradiation.

U.S. Pat. No. 5,677,538 discloses an UV detector consisting of a metal-semiconductor-metal structure (i.e. two back-to-back Schottky junctions) which requires application of a bias during normal operation. For the detector, UV detection is performed in the semiconductor material located between the two interdigitated Schottky junctions. The two Schottky junctions are formed by the deposition of a thick metal layer on the GaN thin films. In addition, materials of the detector are fabricated by using an Electron Cyclotron Resonance (hereinafter referred to as "ECR") plasma source. Most importantly, the GaN epitaxial layer of the detector is grown on a single buffer layer. A disadvantage of the UV detector with such structure is in that its UV detecting performance will gradually degrade with elapse of time and also a voltage bias is required for the operation of the device.

Therefore, it is required to provide an UV detector which is stable and reliable, and has high UV radiation hardness.

SUMMARY OF THE INVENTION

An object of the present invention is to develop an UV detector which has significantly improved reliability and UV radiation hardness as compared with the conventional UV detectors, and can keep good responsivity even after a prolonged exposure to a high intensity UV irradiation.

In order to achieve the above-mentioned object, the present invention provides an UV detector, comprising: a sapphire substrate; a high temperature AlN buffer layer grown on the sapphire substrate; an intermediate temperature GaN buffer layer grown on the high temperature AlN buffer layer; a GaN epitaxial layer deposited on the intermediate temperature GaN buffer layer; a Schottky junction formed on top of the GaN epitaxial layer; and a plurality of ohmic contacts also formed on top of the GaN epitaxial layer, wherein, the high temperature AlN buffer layer and the intermediate temperature GaN buffer layer together form a double buffer layer structure so as to improve the reliability and radiation hardness of the UV detector; and wherein the high temperature AlN buffer layer and the intermediate temperature GaN buffer layer are formed by RF-plasma enhanced MBE growth technology.

According to the UV detector as described above, the high temperature AlN buffer layer is grown at a temperature from 740° C. to 820° C. to have a thickness ranging from 20 nm to 50 nm.

According to the UV detector as described above, the intermediate temperature GaN buffer layer is grown at a temperature from 600° C. to 700° C. to have a thickness ranging from 400 nm to 1.2 µm.

According to the UV detector as described above, the GaN epitaxial layer is a slightly n-type semiconductor layer with doping concentration ranging from $5 \times 10^{16}$ cm$^{-3}$ to $5 \times 10^{17}$ cm$^{-3}$.

According to the UV detector as described above, the thickness of the GaN epitaxial layer ranges from about 0.5 µm to 1.5 µm.

According to the UV detector as described above, the Schottky junction is semi-transparent, and forms the active region of the UV detector.

The advantages of the present invention are as follows. With the use of a trilayer structure (the GaN epitaxial layer/ the intermediate temperature GaN buffer layer/the high temperature AlN buffer layer), it is possible to greatly improve the reliability and lifetime of the UV detector. This enables the detector to be applied for detecting UV radiation for a long period of time. On the contrary, as to the conventional UV detector without the intermediate temperature buffer layer, the performance will degrades rapidly and the detection result will become inaccurate under a prolonged exposure to UV irradiation.

According to the present invention, the GaN buffer layer and the AlN buffer layer are formed by radio frequency (hereinafter referred to as "RF")-plasma enhanced MBE growth. It has been found that both electronic and optic properties of the GaN thin films are improved with the use of this double buffer layer structure. Moreover, experiments have shown that an initial increase in the thickness of the intermediate temperature buffer layer leads to a steady improvement in both the electronic and optic properties of the films. In other words, the electronic and optic properties of the GaN films improve with the increase in the thickness of the intermediate temperature buffer layer. Preferably, the thickness of the intermediate temperature buffer layer is about 800 nm.

As compared with the UV detector recited in U.S. Pat. No. 5,677,538, the UV detector according to the present invention includes only a Schottky junction, which is formed by depositing a very thin semi-transparent metal film. According to the present invention, the UV detection is performed on the Schottky junction by allowing UV radiation passing through the thin metal film that forms the Schottky junction. Besides, the detector according to the present invention is formed by using a RF-plasma source. Thus, the UV detector according to the present invention is different, both in terms of structure and operation principle, from that disclosed in the U.S. Pat. No. 5,677,538. As a result of this, the UV detector according to the present invention can realize more excellent and stable performance than that disclosed in the above US patent.

The present invention will be further explained with reference to the accompanying drawings and the embodiment as follows.

DETAILED DESCRIPTION OF PREFERRED EMBODIMENTS OF THE INVENTION

Figure 1:
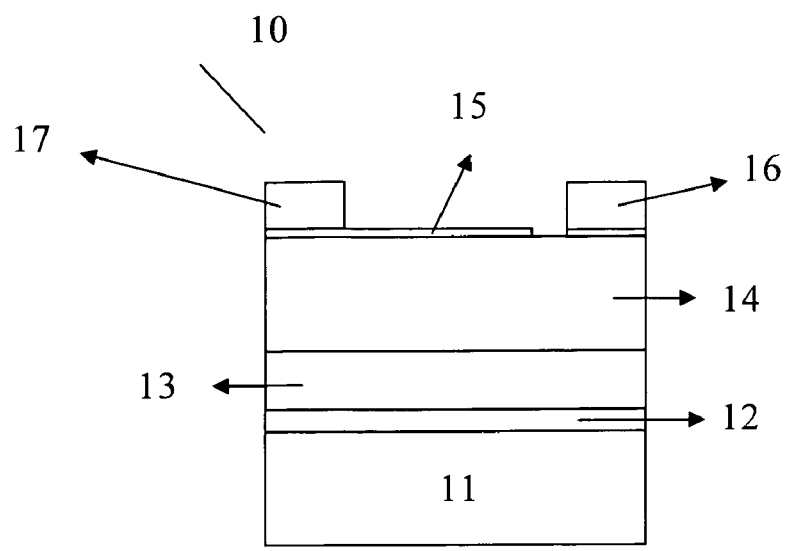
FIG. 1 is a schematic diagram showing a structure of an UV detector according to an embodiment of the present invention.

As shown in FIG. 1, the UV detector 10 of the present invention is configured as follows. Firstly, a high temperature AlN buffer layer 12 is grown on a sapphire substrate 11 at a temperature around 780° C. to have a thickness ranging from 20 nm to 50 nm. Then, on the AlN buffer layer 12, an intermediate temperature GaN buffer layer 13 is grown at a temperature around 600° C. to 680° C. to have a thickness ranging from 400 nm to 800 nm. On the intermediate temperature buffer layer 13, a slightly doped n-type GaN epitaxial layer 14 with doping concentration ranging from $5 \times 10^{16}$ cm$^{-3}$ to about $5 \times 10^{17}$ cm$^{-3}$ is deposited to have a thickness ranging from about 0.5 μm to 1.5 μm. Subsequently, a semi-transparent Schottky junction 15, which consists of a thin layer of nickel (Ni) having a thickness of about 5 nm, is deposited on top of the GaN epitaxial layer 14, and forms the active region of the UV detector. In order to facilitate external contact with the semi-transparent Ni layer, a thick Al bonding pad 17 is deposited on top of the Schottky junction 15 which consists of the semi-transparent Ni layer. The Al bonding pad 17 facilitates wire bonding and electrical contact to the Schottky junction. An ohmic contact 16 is also formed on the epitaxial GaN layer 14 so as to complete the UV detector 10.

Moreover, according to the present invention, the GaN buffer layer and the AlN buffer layer is formed by RF-plasma enhanced MBE growth with operating frequency of 13.6 MHz.

From the above structure of the UV detector according to the present invention, it can be seen that a double buffer layer structure is formed by the high temperature AlN layer 12 and the intermediate temperature GaN buffer layer 13. It has been validated that the reliability of the UV detector significantly improves when it is fabricated on films grown using the unique double buffer layer structure. In addition, the UV detector fabricated with the use of the intermediate temperature GaN buffer layer 13 also shows a significant improvement in the radiation hardness for exposure to high-power UV irradiation.

Figure 2:
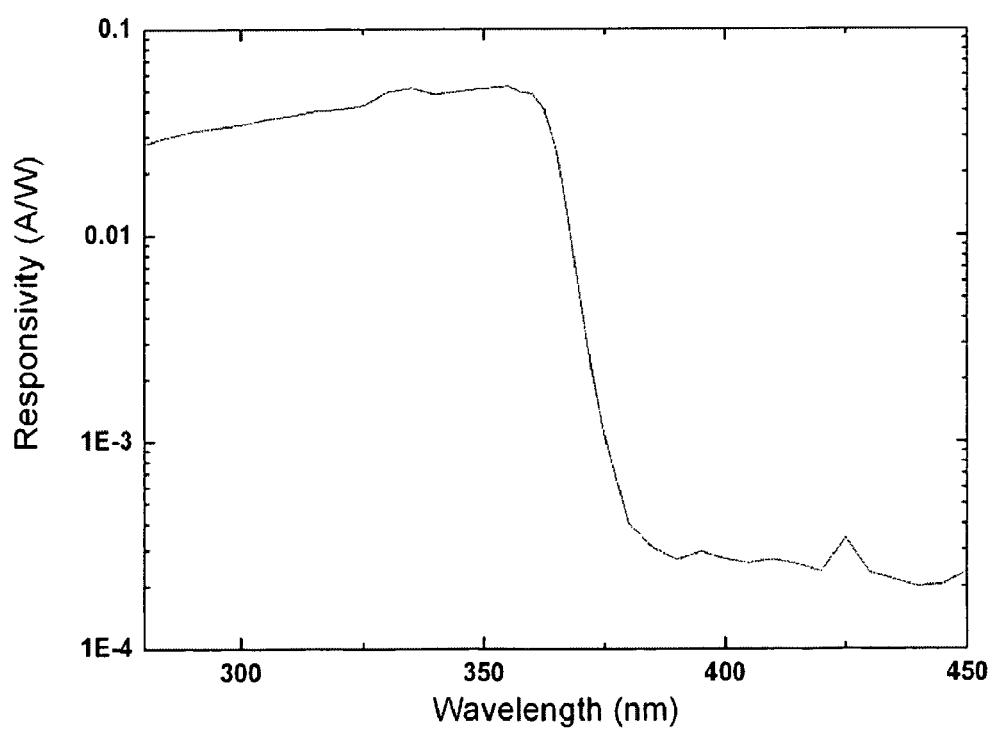
FIG. 2 is a graph showing typical responsivity of the UV detector according to the present invention.
Figure 5:
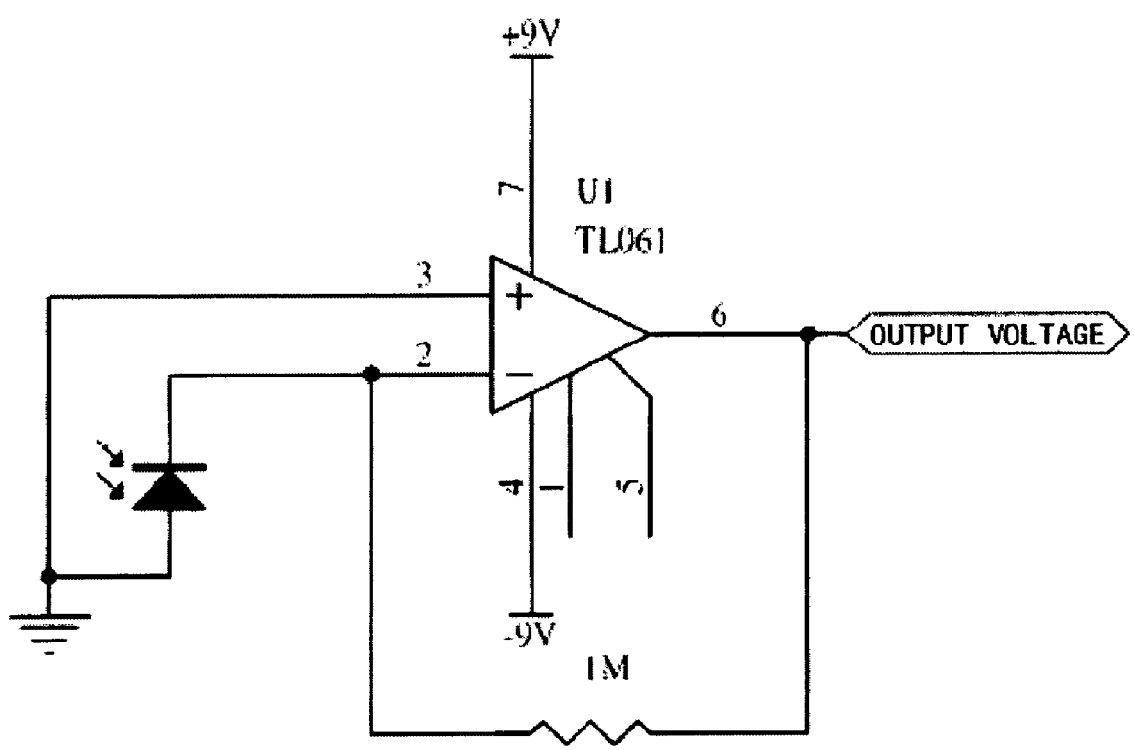
FIG. 5 is a diagram showing a typical circuit used for amplifying photo current.

A typical responsivity of the UV detector with the above-mentioned structure is shown in FIG. 2. It can be seen from FIG. 2 that the UV detector is sensitive only to UV radiation and not sensitive to visible light. During normal operation, no bias is required to be applied to the detector. Upon illumination of the detector by UV radiation, a photocurrent will be generated within the detector. By an operational amplifier using a current-to-voltage conversion configuration, this photocurrent may be amplified and transformed from a current signal to a voltage signal. Thus, the UV radiation intensity can be determined. A typical circuit used for amplifying the photocurrent is shown in FIG. 5.

Figure 3:
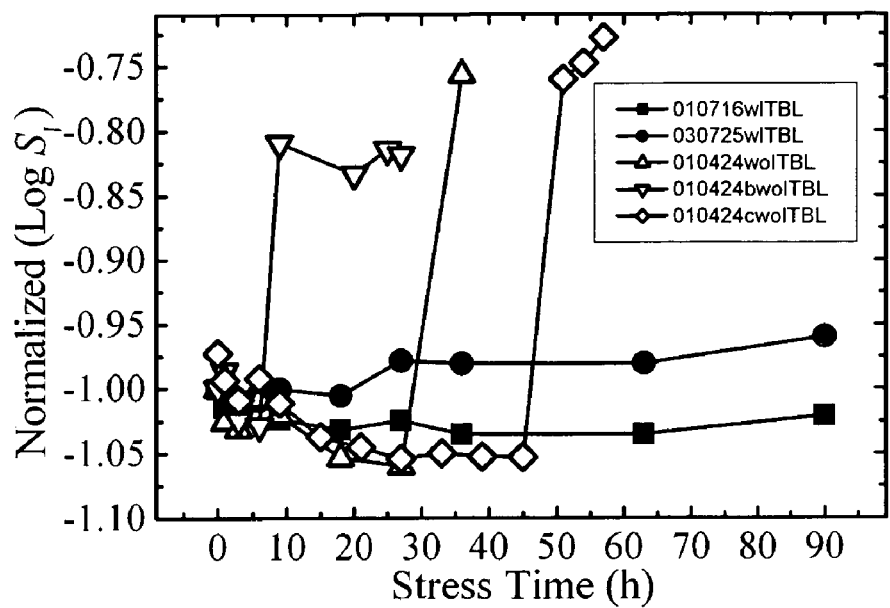
FIG. 3 is a graph showing a comparison of noise power spectral density between the UV detector according to the present invention and the UV detector of the prior art.

FIG. 3 is a graph showing a comparison of noise power spectral density between the UV detector according to the present invention and the UV detector of the prior art. The variation in the noise power spectral density as a function of stress time (i.e. the time of the detector exposed to a high intensity UV radiation source) is shown in FIG. 3.

Low-frequency noise is an important quality factor of detectors. Since the low frequency noise is proportional to trap density of materials, the noise power spectral density can reflects the corresponding defect density due to high power UV irradiation in the GaN films.

The voltage low-frequency noise spectral density in a semiconductor device is given by the following formula:

$$S_V(f) = \frac{V^2}{N^2} \int_x \int_y \int_E 4N_T(E) \frac{\tau}{1 + 4\pi^2 \tau^2} dx\, dy\, dE, \quad (1)$$

wherein $N_T(E)$ is a trap density at energy E, τ is a fluctuation time constant, V is a DC voltage applied to the device and N is a total carrier density in the active region of the device. The formula (1) shows that low-frequency noise power spectral density is directly proportional to the trap density such as crystalline defects. Such defects have significant effect on efficiency of the UV detector. Experimental results of noise measurements over a wide range of temperature show that the systematic low-frequency noise is decreased with the use of the intermediate temperature buffer layer (hereinafter referred to as "ITBL"). Preferably, the thickness of the ITBL is determined to be 800 nm at which the noise level is minimized.

In the case as shown in FIG. 3, the intensity of the UV radiation is about 1000 times as that of the solar UV power. It can be seen from FIG. 3 that the detectors fabricated without using the ITBL (represented by hollow triangles and hollow diamonds), experience a significant degradation in the noise power spectral density after 45 hours of exposure to UV irradiation, which indicates the corresponding degradation in the material quality of the GaN films. However, the detectors fabricated with an ITBL show insignificant changes in the noise power spectral density even after 90 hours of light stress. This shows that the double buffer layer structure of the present invention remarkably prevents the GaN film from being damaged by the high intensity UV irradiation and thereby the stability and lifetime of the UV detector is improved.

Figure 4:
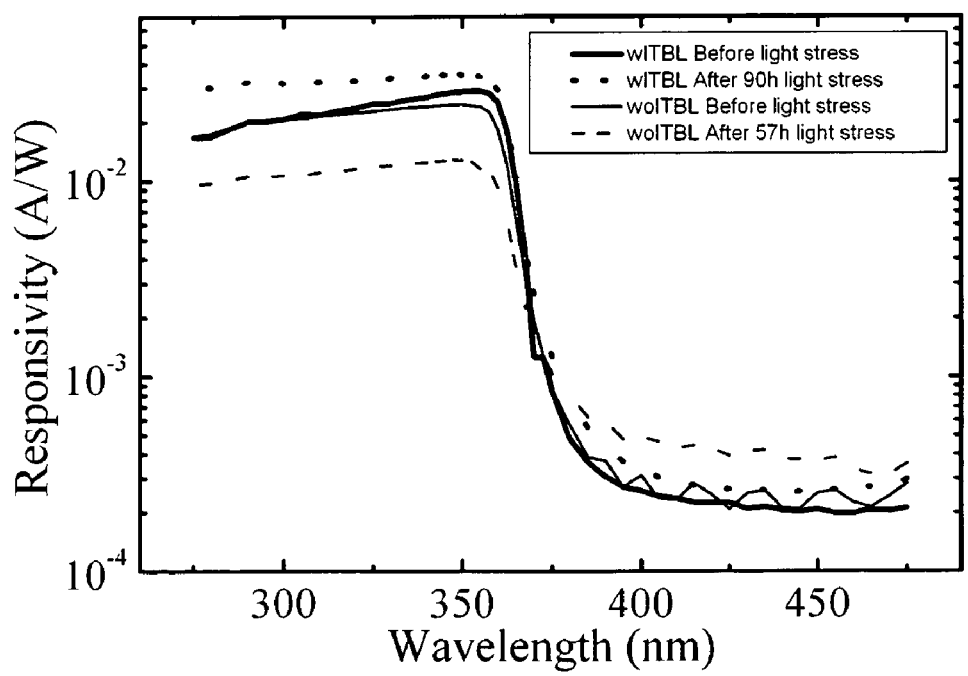
FIG. 4 is a graph showing a comparison of responsivity between the UV detector according to the present invention and the UV detector of the prior art.

FIG. 4 is a graph showing a comparison of responsivity between the UV detector according to the present invention and the UV detector fabricated with the use of the conventional buffer layer structure. The typical variation in the responsivity before and after high intensity UV irradiation is shown in FIG. 4. In the figure, thick solid line represents a responsivity curve of the UV detector fabricated with an ITBL before UV irradiation, and the dotted line represents a responsivity curve of the UV detector fabricated with an ITBL after 90 hours of UV irradiation, while the thin solid line represents a responsivity curve of the UV detector fabricated without an ITBL before UV irradiation and dashed line represents a responsivity curve of the UV detector fabricated without an ITBL after 57 hours of UV irradiation.

It can be seen from FIG. 4 that the UV detector fabricated with the use of an ITBL did not experience any degradation in the responsivity after 90 hours of high power UV irradiation. On the contrary, slight increase in the responsivity of the UV detector is possible due to annealing effect caused by the irradiation process. For the detector fabricated without an ITBL, about 50% degradation in the responsivity at 350 nm is observed after just 57 hours of UV irradiation, and more importantly, the signal in the visible range (at wavelength >400 nm) is seen to increase dramatically. As a result, the normal operation of the detector is significantly hampered. It is further noted from FIG. 3 that the detector fabricated without ITBL becomes nonfunctional after 35 hours of UV irradiation. It is not necessary to expose the detector to high power UV irradiation for more than 90 hours, because the total amount of UV radiation of 90 hours is equivalent to that of solar UV irradiation of about 30 years on the assumption that the time of exposure to solar UV irradiation is 10 hours each day.

The present invention has been described in way of example above. The scope of the invention should be defined by the claims appended below.

What is claimed is:

1. An ultraviolet detector, comprising:
   a sapphire substrate;
   a high temperature AlN buffer layer grown on the sapphire substrate;
   an intermediate temperature GaN buffer layer grown on the high temperature AlN buffer layer;
   a GaN epitaxial layer deposited on the intermediate temperature GaN buffer layer;
   a Schottky junction formed on top of the GaN epitaxial layer; and
   a plurality of ohmic contacts also formed on top of the GaN epitaxial layer,
   wherein, the high temperature AlN buffer layer and the intermediate temperature GaN buffer layer together form a double buffer layer structure so as to improve the reliability and radiation hardness of the ultraviolet detector; and wherein the high temperature AlN buffer layer and the intermediate temperature GaN buffer layer are formed by RF-plasma enhanced MBE growth.

2. The ultraviolet detector according to claim 1, wherein the high temperature AlN buffer layer is grown at a temperature from 740° C. to 820° C. to have a thickness ranging from 20 nm to 50 nm.

3. The ultraviolet detector according to claim 1, wherein the intermediate temperature GaN buffer layer is grown at a temperature from 600° C. to 700° C. to have a thickness ranging from 400 nm to 1.2 μm.

4. The ultraviolet detector according to claim 1, wherein the GaN epitaxial layer is a slightly doped n-type semiconductor layer with doping concentration ranging from $5\times10^{16}$ $cm^{-3}$ to $5\times10^{17}$ $cm^{-3}$.

5. The ultraviolet detector according to claim 1 or claim 4, wherein the thickness of the GaN epitaxial layer ranges from about 0.5 μm to 1.5 μm.

6. The ultraviolet detector according to claim 1, wherein the Schottky junction is semi-transparent, and forms an active region of the UV detector.

\* \* \* \* \*